(12) United States Patent
Hacker

(10) Patent No.: US 9,355,891 B2
(45) Date of Patent: May 31, 2016

(54) METHOD FOR EXPOSING A LAYER

(71) Applicant: Fraunhofer-Gesellschaft zur Foerderung der angewandten Forschung e.V., Munich (DE)

(72) Inventor: Erwin Hacker, Kaufbeuren (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 100 days.

(21) Appl. No.: 14/179,002

(22) Filed: Feb. 12, 2014

(65) Prior Publication Data

US 2014/0227875 A1 Aug. 14, 2014

(30) Foreign Application Priority Data

Feb. 14, 2013 (DE) .......................... 10 2013 202 458

(51) Int. Cl.
*H01L 21/44* (2006.01)
*H01L 21/768* (2006.01)
*H01L 23/48* (2006.01)
*H01L 21/033* (2006.01)
*H01L 21/311* (2006.01)

(52) U.S. Cl.
CPC ...... *H01L 21/76802* (2013.01); *H01L 21/0334* (2013.01); *H01L 21/31116* (2013.01); *H01L 21/76898* (2013.01); *H01L 23/481* (2013.01); *H01L 2924/0002* (2013.01)

(58) Field of Classification Search
CPC ..................................................... H01L 21/44
See application file for complete search history.

(56) References Cited

U.S. PATENT DOCUMENTS 6,444,575 B1 9/2002 Yu et al.
2012/0286430 A1 11/2012 Kraft et al.

FOREIGN PATENT DOCUMENTS

KR 10 2005 0052178 A 6/2005

*Primary Examiner* — Marvin Payen
(74) *Attorney, Agent, or Firm* — Keating & Bennett, LLP

(57) ABSTRACT

A method for exposing a layer buried in a substrate via a trench having an insulated lateral wall and an insulated floor includes the steps of applying an oxide onto the substrate and anisotropic etching. Applying the oxide onto the substrate takes place at least in a region of the trench such that the oxide protrudes from an edge of the trench into the trench. The protruding oxide shields the insulated lateral wall of the trench when anisotropically etching at least the insulated floor of the trench.

19 Claims, 12 Drawing Sheets

METHOD FOR EXPOSING A LAYER

CROSS-REFERENCE TO RELATED APPLICATION

This application claims priority from German Patent Application No. 102013202458.4, which was filed on Feb. 14, 2013 and is incorporated herein by reference in its entirety.

BACKGROUND OF THE INVENTION

Embodiments of the present invention relate to a method for exposing a layer buried in a substrate.

Exemplarily, a layer, such as, for example, a buried metallic contact pad, in a substrate, such as, for example, in a wafer, is exposed here so as to be able to produce electric contact from the back side to the exposed layer.

Conventionally, contacting of this kind is done by opening the back side of the substrate by means of etching. A wet-chemical etching method, exemplarily using TMAH (tetra methyl ammonium hydroxide), in silicon wafers or a dry-etching method, such as, for example, reactive ion etching, corresponding to the Bosch process is exemplarily used here. Wet-chemical etching is plane-selective so that the patterns may also be adjusted well in the trench to be etched. Additionally, due to the high flank angle of 40-50°, it is also possible to adapt the patterns within the trench by means of lithography. This is based on the fact that depositing a photoresist, for example by means of a spray coating process, is possible starting from a sufficiently wide trench or sufficiently large flank angle, which is the prerequisite for lithography. However, the large flank angle is also of disadvantage since much space is required per trench, depending on the thickness of the substrate. In the dry-etching processes mentioned before, a large aspect ratio is possible such that deep trenches may also be generated at smaller a surface consumption, however, processing the patterns in the trenches is not possible or only to a limited degree due to the lacking or poor suitability for lithography. Consequently, there is demand for an improved approach.

SUMMARY

According to an embodiment, a method for exposing a layer buried in a substrate via a trench having an insulated lateral wall and an insulated floor may have the steps of: applying an oxide onto the substrate at least in a region of the trench such that the oxide protrudes from an edge of the trench into the trench; and anisotropically etching at least the insulated floor of the trench, the insulated lateral wall being shielded by the oxide protruding into the trench.

According to another embodiment, a method for exposing a layer buried in a substrate via a vertical electrical connection arranged in a trench, the trench having an insulated lateral wall and an insulated floor, may have the steps of: applying an oxide onto the substrate at least in a region of the trench such that the oxide protrudes from an edge of the trench into the trench; anisotropically etching at least the insulated floor of the trench, the insulated lateral wall being shielded by the oxide protruding into the trench; and producing a contacting layer on the insulated lateral wall such that the contacting layer is in contact with the layer and the contacting layer extends from a surface of the substrate along the lateral wall to the layer.

Embodiments of the present invention provide a method for exposing a layer buried in a substrate, such as, for example, a metal layer to be contacted, via a trench comprising an insulated lateral wall and insulated floor. The method comprises the steps of applying an oxide onto the substrate at least in a region of the trench and anisotropically etching at least the insulated floor of the trench. More specifically, the oxide in the trench is applied such that the oxide protrudes from an edge of the trench at the surface into the trench or trench center. When subsequently anisotropically etching, this protruding oxide shields the insulated lateral wall such that same or the insulator on the later wall 12s is not etched, but only the floor 12b is etched.

In the embodiments of the invention, the effect of an oxide being applicable onto a substrate comprising a trench by means of certain manufacturing technologies (exemplarily plasma deposition of $SiO_2$ oxide) such that the oxide protrudes over the trench edge towards the trench center is made use of. The overhang produced in this way at the trench edge shields the trench lateral wall from directly impinging radiation, exemplarily ion bombardment. This means that the overhang allows preventing the lateral wall to be etched partly when anisotropically etching the trench floor, since the ions used exemplarily for anisotropic etching propagate through the substrate perpendicularly or rectilinearly. Consequently, this means that it is possible to selectively remove an insulation oxide on the trench floor, whereas the same insulation oxide is not etched away at the trench lateral wall, without having to employ lithographic steps. This means that this method of manufacturing allows realizing the pattern to be processable despite the narrow trench.

In correspondence with further embodiments, another effect occurring when depositing the oxide may be made use of, i.e. the fact that the depositing rate on the first main surface of the substrate (exemplarily wafer back side) is higher than that on the trench floor. Consequently, a thicker oxide layer is advantageously deposited on the first main surface than on the trench floor so that, when performing anisotropic etching, at first the trench floor is open before the oxide on the first main surface is removed.

In correspondence with further embodiments, the method may also include further steps, namely applying a contact layer in the trench or metalizing the trench or, more precisely, the opened trench floor and the trench lateral walls, in order to contact the exposed layer and thus produce electric contact in the deep etched pattern, i.e. a via or a vertical electrical connection.

In correspondence with further embodiments, the method may also include the steps of etching the trench and applying the insulation oxide on the trench floor and, in particular, on the trench lateral walls. It is to be noted that etching may be performed by means of deep trench etching, i.e. for example by means of reactive ion etching (RIE), or wet-chemically with a suitable crystal orientation.

In correspondence with further embodiments, it is also possible, after applying the contacting layer, to coat same by means of an insulation substrate such that further processing is possible, exemplarily by means of lithographic method steps and etching steps.

BRIEF DESCRIPTION OF THE DRAWINGS

Embodiments of the present invention will be discussed referring to the appended drawings, in which.

DETAILED DESCRIPTION OF THE INVENTION

Figure 1:
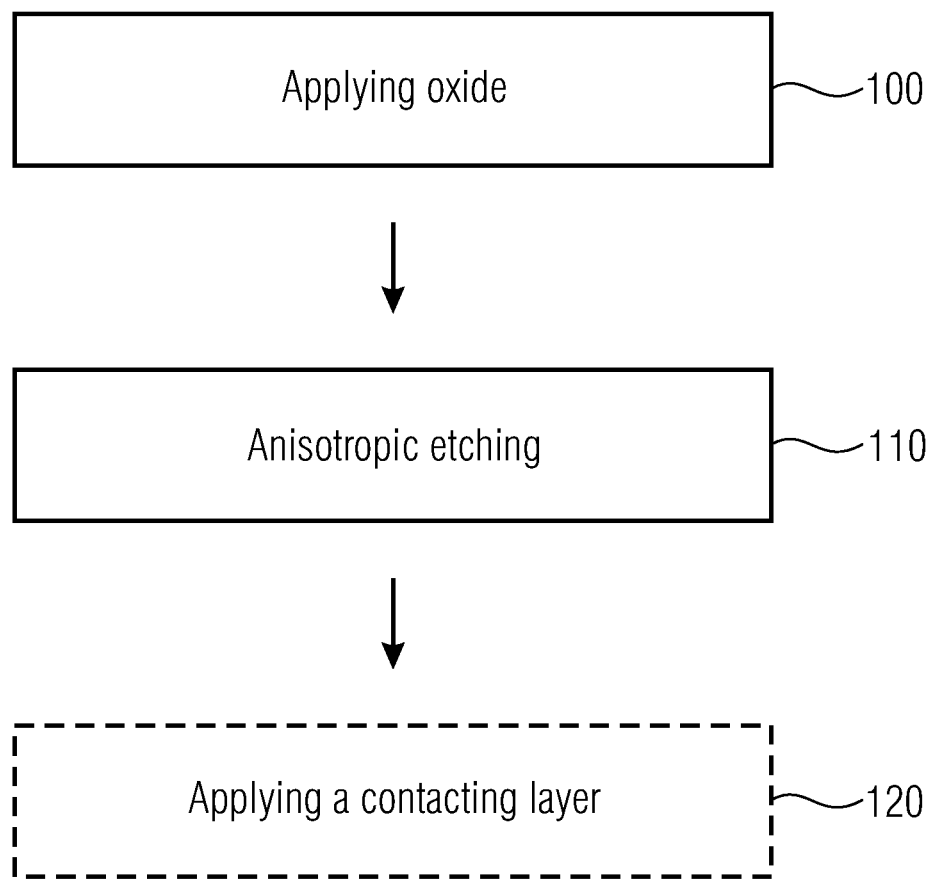
FIG. 1 shows a schematic flowchart of the method for exposing a layer buried in a substrate in accordance with an embodiment.

Before embodiments will be discussed below in greater detail referring to the figures, it is to be pointed out that same elements, structures or method steps or such of the same effect are provided with same reference numerals in order for the description thereof to be mutually applicable or exchangeable.

Figure 2A:
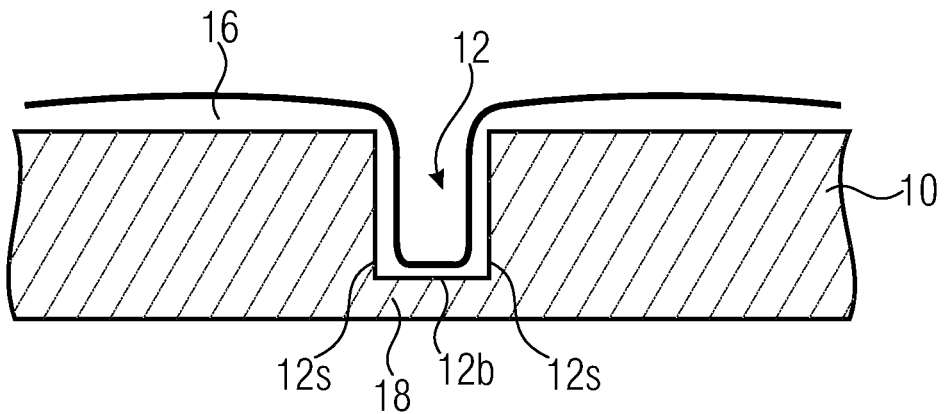
FIGS. 2a-d show schematic intermediate products for the method of manufacturing illustrated in FIG. 1.

FIG. 1 shows a flowchart for exposing a layer 18 buried in a substrate 10. As is shown in FIG. 2a, the process starts with a substrate, such as, for example, a silicon substrate or silicon wafer 10, comprising a trench 12, such as, for example, a trench of a high aspect ratio (trench depth relative to trench width) of 10:1 or 20:1 (or, generally, larger than 5:1). In addition, an insulation oxide layer 16, which is also referred to as SACVD oxide, is applied onto the substrate 10 in such a way that same is attached at least at the trench floor 12b and at the trench lateral walls 12s. The layer 18 to be exposed is located in the region of the trench floor 12b, i.e. below the insulation layer 16.

Figure 2B:
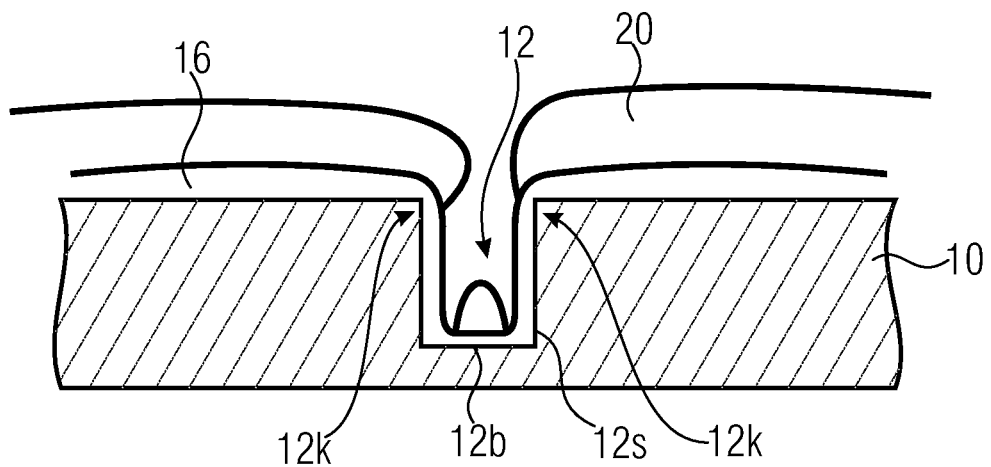

Starting from this substrate, in a first step 100, an oxide 20, such as, for example, an $SiO_2$ oxide, is applied onto the substrate 10, or insulation oxide 16, such that the oxide 20 protrudes from the edge 12k of the trench 12 towards the trench center and thus forms an overhang (cf. FIG. 2b). This overhang of the oxide 20 serves for protecting or shielding the lateral wall 12s of the trench 12 from radiation, such as, for example, ion radiation occurring in ion etching. This means that the overhang of the oxide 20 takes the function of a photoresist, without the oxide 20 being applied onto the lateral wall 12k of the trench to be protected or, more precisely, onto the insulation oxide 16. The process of oxide deposition may exemplarily take place by means of a plasma deposition process. It is to be noted that the oxide 20 may also attach partly to the trench floor 12b, wherein the deposition rate of the oxide 20 here (with large aspect ratios) is typically smaller than the deposition rate on the main surface region of the substrate 10. Consequently, the layer thickness of the oxide 20 on the substrate floor 12b is smaller than the layer thickness of the oxide 20 on the main surface of the substrate 10.

Figure 2C:
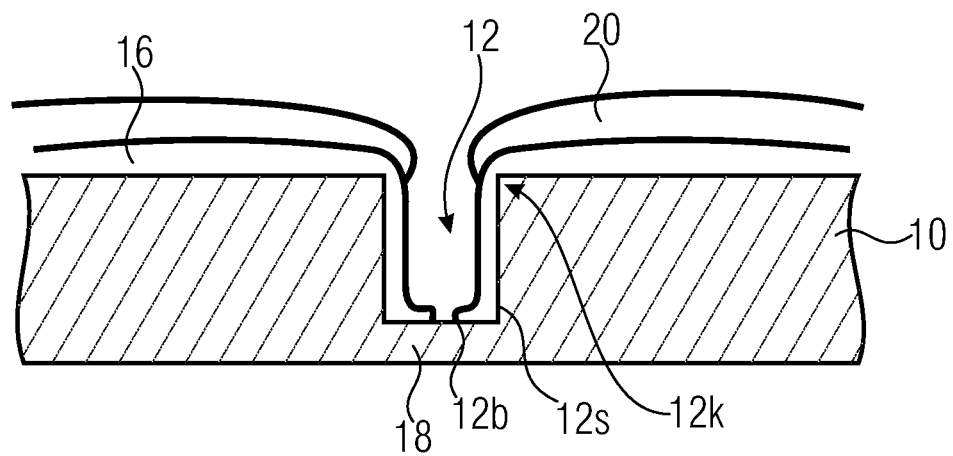

The trench floor 12b is opened in a next step 110 of anisotropic etching, which is illustrated in FIG. 2c. Reactive ion etching, using fluorine, is exemplarily employed here, wherein reactive ions are generated in a gas plasma. Since the oxide 20 in the etching environment generated in this way cannot be dissolved spontaneously, additional energy is introduced via an electrical alternating field by means of which the reactive ions are accelerated or are provided with the kinetic energy necessitated for removing or dissolving the oxide 20. Accelerating the ions typically results in a rectilinear movement of the ions in the etching direction, consequently ions do not impinge directly on the shielded regions, i.e. the lateral walls 12s of the trench 12. The directly impinging ions, i.e. those impinging on the oxide 20, or insulation oxide 16, on the trench floor 12b, result in the oxide 20 being removed on the substrate 10. Thus, the oxide 20 on the floor 12b is opened or the buried layer 18 exposed, which may then be contacted, wherein advantageously the lateral walls 12s are still covered by the insulation oxide 16. It is to be pointed out here that the oxide 20 arranged on the first main surface is also partly etched, wherein typically same is not removed completely due to the differences in thickness of the oxide layers (see above).

Figure 2D:
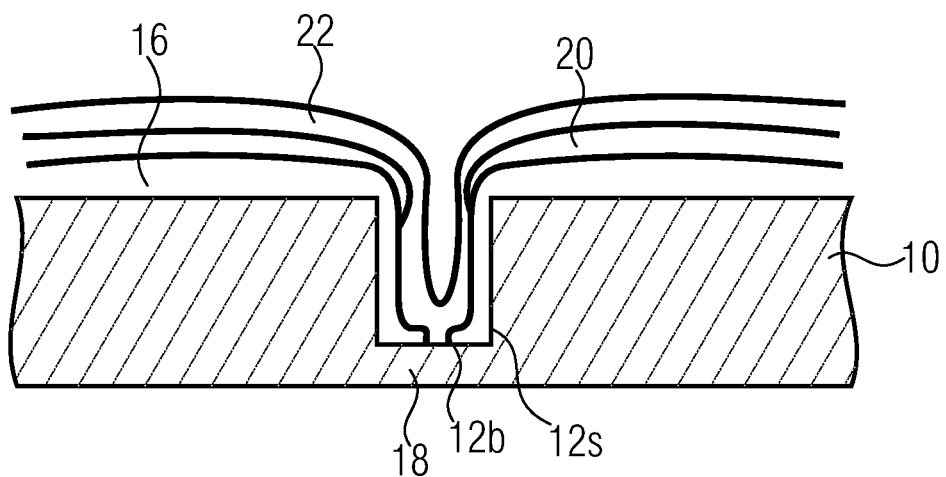

In a next, optional, step 120, the exposed layer 18 may be contacted (compare FIG. 2d). Here, the trench wall 12 including the exposed contact 18 is covered by a conductive material 22, such as, for example, a metal or polysilicon. In particular, wolfram, copper or aluminum are suitable for contactings on a metal basis (metallizations), which are exemplarily introduced into the trench 12 by means of chemical vapor deposition or by means of wolfram chemical vapor deposition (W-CVD) such that the conductive material 22 is attached to the exposed layer 80 (compare trench floor 12b) and the trench lateral walls 12s. Thus, a conductive layer which is insulated relative to the substrate 10 along the trench sides 10s by the insulation oxide 16 is formed over the entire trench depth of the trench 12. It is noted here that the trench 12 may also extend over the entire substrate thickness, exemplarily 725 µm, or at least 90% of the substrate thickness such that it is possible to produce contacts or vias over the entire substrate thickness without any lithographic process steps, even if the diameter of the trench 12 in which the via is to be produced is very small, i.e. exemplarily smaller than 300 µm or even smaller than 200 µm. Due to the reduced area consumption of each individual contact, the number of contacts per area may be increased.

Subsequently, the method for opening or contacting the buried layer will be described in detail using the intermediate products (in sectional view each) referring to FIGS. 3a to 3g, together with the optional steps, whereas FIGS. 4a to 4g show a variation of the method, also including optional steps.

Figure 3A:
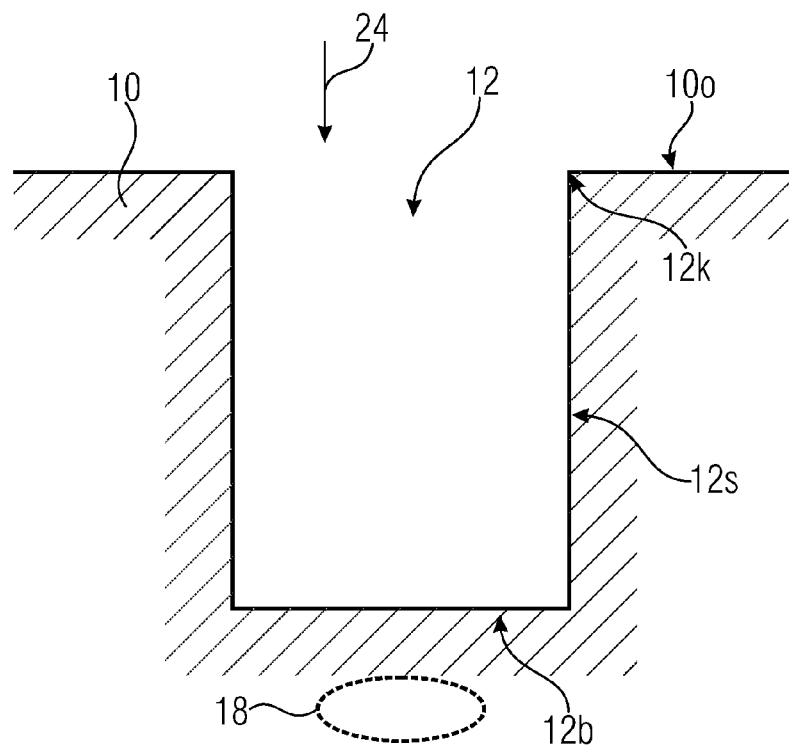
FIGS. 3a-3g show the method steps for exposing a layer buried in a substrate, including optional steps for a substrate without any stop layer.

FIG. 3a shows a substrate 10, exemplarily a silicon wafer, into which the trench 12 has been introduced which may exemplarily comprise a width of 200 µm with a depth of 500-600 µm. The depth may also extend over the entire thickness of the substrate 10, exemplarily 725 µm (or generally 250-1000 µm). Introducing may exemplarily take place by means of (wet-chemical) etching or, advantageously, by means of a dry-etching process, corresponding to the Borsch process (further development of reactive ion etching). A large aspect ratio, such as, for example, 15:1 or at least 5:1, may be achieved by dry etching corresponding to the Borsch process. Very steep lateral walls 12s may be produced here, which thus extend parallel or nearly parallel (+/−2° or 5° deviation) to the etching direction 24. The etching direction 24 in turn is perpendicular to the first main surface region 10o of the substrate 10, the result being a nearly rectangular edge 12k at the trench border 12. It is to be pointed out here that etching typically takes place from the back side such that the first main surface region 10o represents the back side of the substrate 10. As can be gathered from the Figure, etching here includes a stop in the substrate 10 (or in the silicon), wherein consequently the region 18 to be contacted or layer 18 to be exposed is in the substrate 10.

Figure 3B:
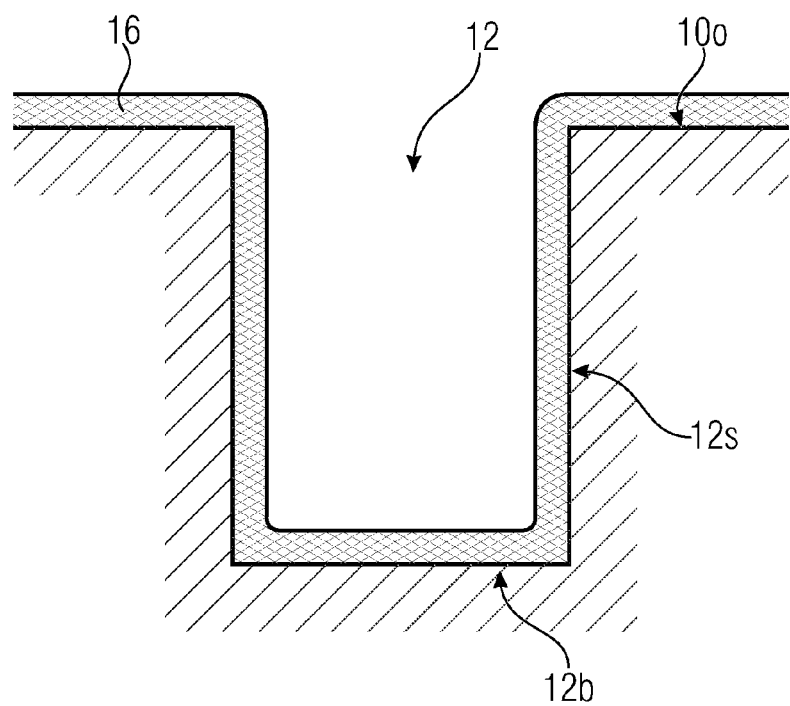

Optionally, after etching, a step of cleaning the etched structure may take place, before, in the next step illustrated in FIG. 3b, the insulation substrate 16 is applied.

FIG. 3b shows the substrate 10 including the trench 12, wherein the insulation oxide 16 has been applied at least in the region of the trench. Here, the insulation oxide 16 covers both the trench floor 12b and the lateral walls 12s, wherein in these embodiments the insulation layer 16 is implemented so as to also cover the main surface region 10o of the substrate 10. The insulation layer 16 exemplarily includes an oxide or silicon oxide which exemplarily is applied by means of sub-atmospheric pressure chemical vapor deposition (SACVD), by means of low-pressure chemical vapor deposition (LPCVD), or generally by means of vacuum chemical vapor deposition. Alternatively, a different coating method and/or using other insulating material would also be possible for realizing applying an insulation layer 16 onto the lateral walls 12*s* and the floor 12*b*. After having insulated the trench 12 over the entire area, the insulation 16 is opened partially, in particular at the trench floor 12*b*, as is illustrated in FIGS. 3*c* and 3*d*.

Figure 3C:
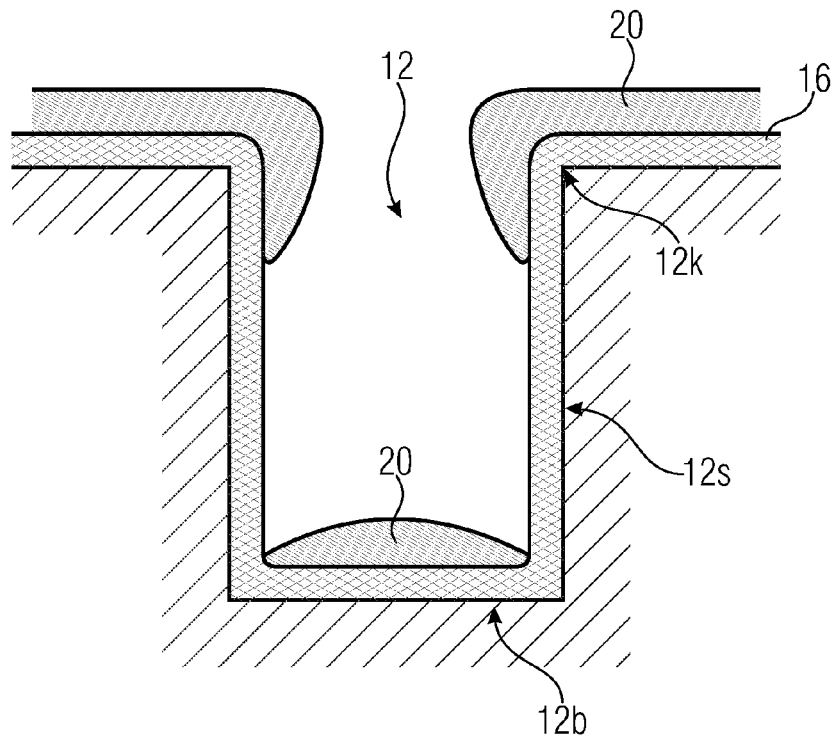

FIG. 3*c* shows the structure from FIG. 3*b* in which another oxide 20 is applied on the main surface 10*o* or, more precisely, on the main surface region 10*o* covered by the insulation oxide 16. As has already been described in FIG. 1 and FIGS. 2*a* to 2*d*, depositing the (SiO$_2$) oxide 20 takes place such that overhangs towards the trench center are formed at the edges 12*k* or such that the overhangs formed of the oxide 20 constrict the trench 12. Plasma deposition of the oxide 20 is a particularly suitable manufacturing technology, which therefore may also be referred to as plasma oxide. As has been hinted at before, it is of advantage in this method for the deposition rate on the wafer surface 10*o* to be greater than in the etched structure 12, since in this way (at least with large aspect ratios) it may be guaranteed that the floor 12*b*, when subsequently etching, is opened before the main surface region 10*o*. The deposition is smallest in particular at the borders at the trench floor 12*b*, cf. intersection 12*b*-12*s*, whereas the deposition rate is greatest at the top edge 12*k*. The result is an irregular layer thickness at the floor of the etched structure 12 which all in all is smaller than that on the wafer surface 10*o*.

Figure 3D:
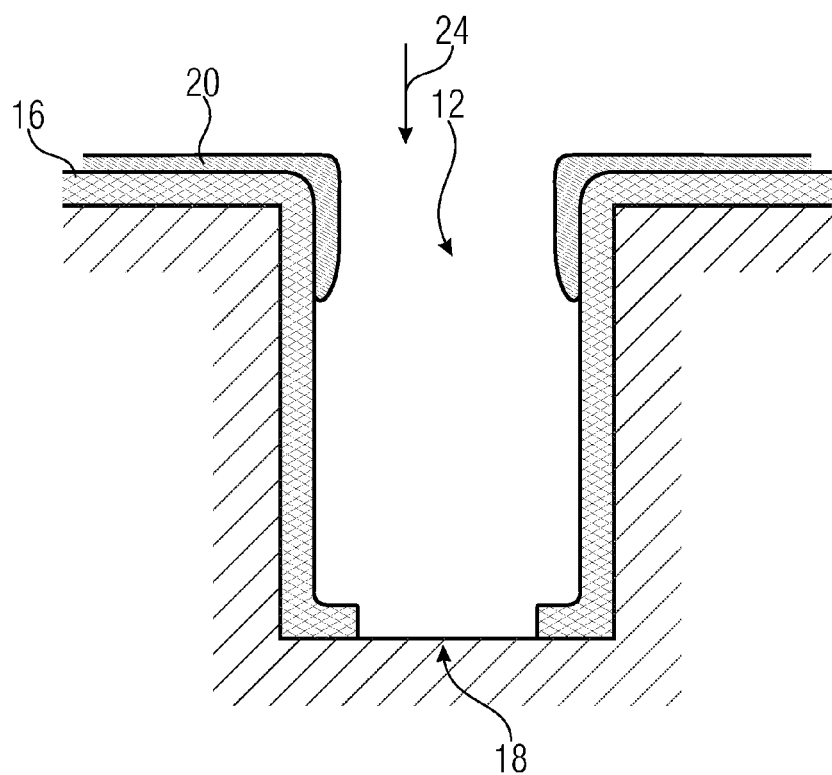

Subsequently, the oxide 20 is etched back using a suitable anisotropic process, as is illustrated in FIG. 3*d*. As has been discussed before, a process in which the reactive ions generated in the plasma are accelerated towards the surface 10*o* by a low-frequency alternating field, exemplarily 13 MHz (or generally in the region of 0.5 MHz to 100 MHz), is particularly suitable. Here, in correspondence with further embodiments, the frequency of the alternating field may be adapted to the depth of the trench 12 such that exemplarily the mean free path length of a reactive ion is greater than the depth of the trench, wherein consequently the reactive ions impinge on the trench floor 12*b* at a sufficient kinetic energy. It is also pointed out that ambient pressure may also have an influence on the mean free path length. When sticking to the boundary conditions discussed, a uniform etching rate may be achieved on the wafer surface 10*o* and the trench floor 12*b* using such an etching technology. Since the oxide thickness of the oxide 20 at the trench floor 12*b* varies and, in particular, is smaller when compared to the oxide thickness on the surface 10*o*, the oxide 20 on the floor 12*b* will be removed first at least in the edge region by the anisotropic etching such that the buried layer 18, such as, for example, the contact area made of silicon or metal, will be exposed. The lateral walls 12*s* are spared the etching attack since they are protected from ion bombardment due to the depositing characteristic (overhang) of the plasma process (compare above).

After optionally cleaning the wafer, another optional step for preparing for applying the contacting takes place. Here, ion implantation, including the respective heating steps, is performed in order to improve the contact. Furthermore, further preparing steps may be performed, such as, for example, an RF dip process (hydrofluoric cleaning) with silicon contacts or back sputtering process with metal contacts.

In a next step, the metallization 22 or, generally, the contacting layer 22 is introduced into the trench 12 such that the contacting layer 22 is in contact with the exposed layer 18 and the contacting layer 22 extends from the surface 10*o* via the lateral wall 12*s* to the exposed layer 18. It is also obvious from the illustration that the contacting layer 22 is advantageously applied at a constant layer thickness and thus forms a U-shape or is arranged in the trench 12 in a U-shape. As has already been mentioned, applying may advantageously take place by means of wolfram chemical vapor deposition (W-CVD).

Figure 3E:
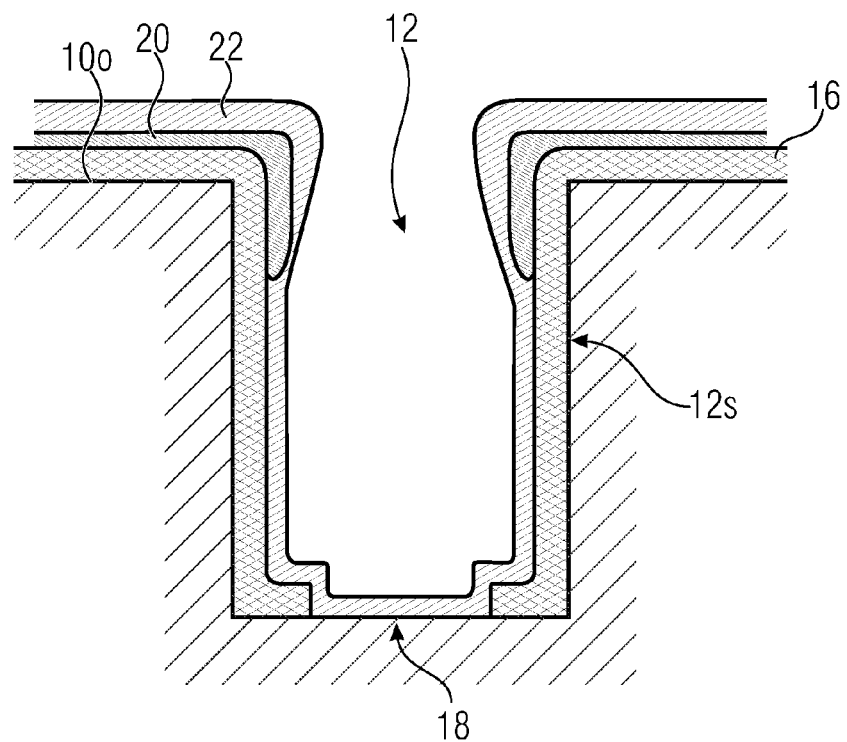
Figure 3F:
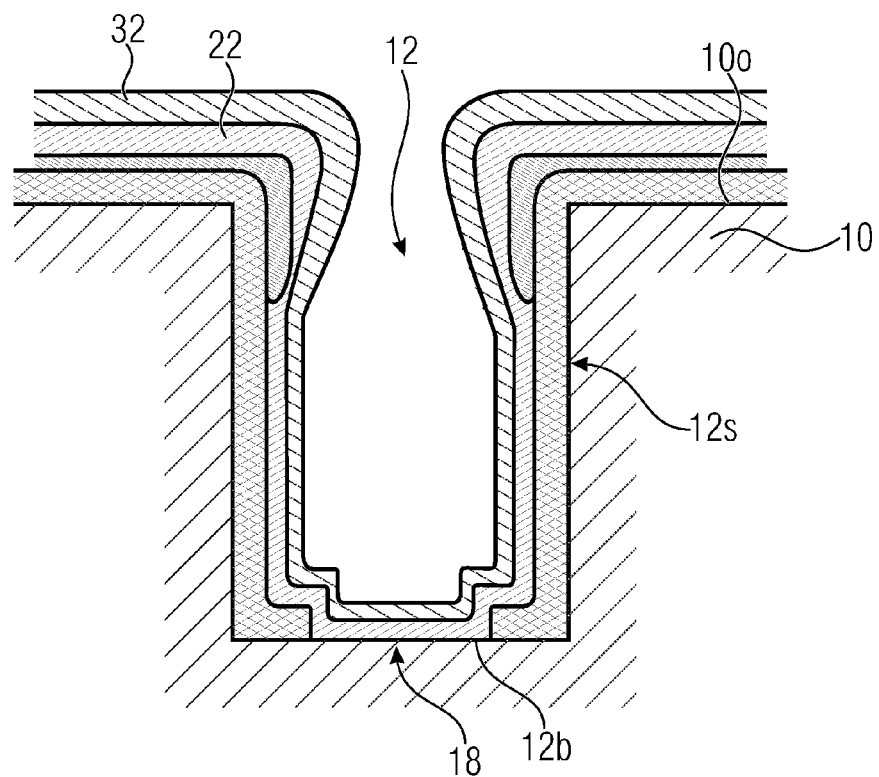

In a next step illustrated in FIG. 3*f*, the substrate 10 is again covered by a conformingly covering SACVD oxide layer or insulation oxide layer 32 in order to insulate the contacting layer 22 deposited and protect same from subsequent manufacturing steps (exemplarily etching). As has been described in FIG. 3*b*, applying the insulation layer 32 exemplarily takes place by chemical vapor deposition of an insulation oxide 32 such that both the lateral walls 12*s* and the trench floor 12*b* and the substrate surface 10*o* are covered. The insulation oxide 32 here may basically correspond to the insulation oxide 16 discussed in FIG. 3*b*. A passivation layer may also be applied here at the same time.

Figure 3G:
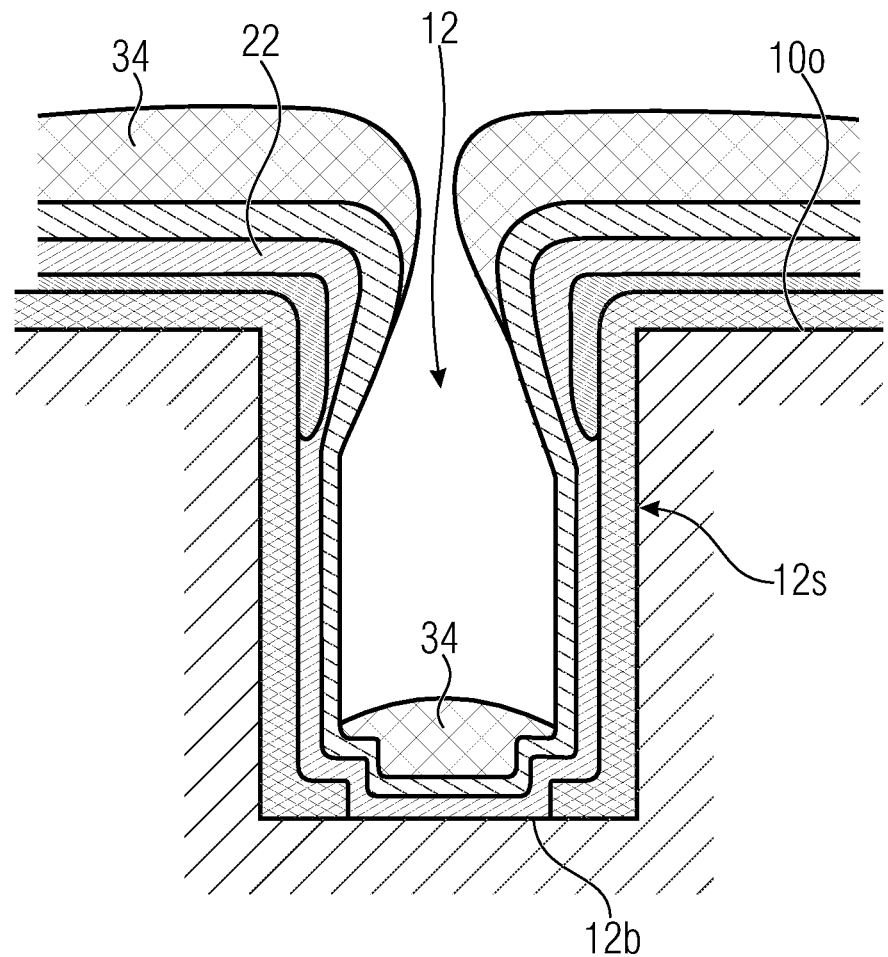

As is illustrated in FIG. 3*g*, patterning the metal or the electrically conducting contacting layer 22 may be prepared subsequently. A resist 34 is exemplarily applied here by means of a spray coating process (spray coating process or, alternatively, dry resist process). Normally, it is sufficient for the substrate surface 10*o* and the trench floor 12*b* to be covered by the photo resist 34, since the lateral walls 12*s* are protected sufficiently by the oxide 20. Etching may exemplarily again take place using a plasma etching or dry etching process (anisotropically) which may exemplarily comprise several process steps. These lithographic steps and etching steps may be repeated or vary, depending on the patterning process to be performed.

In accordance with further embodiments, after the step illustrated in FIG. 3*s* of applying the insulation oxide 32, the trench 12 may also be filled completely such that exemplarily the trench is provided in the contact region 18 with a protective layer of a thickness of 5 µm.

Before the method will be discussed referring to FIGS. 4*a* to 4*g* using another case of application, including certain variations, it is to be pointed out that all the steps described before may be performed using conventional equipment of semiconductor industry such that it is possible, without any new manufacturing equipment, to process the deep-etched structure 12 (more precisely: structure at the floor 12*b* of the trench 12), without any lithographic process steps.

Figure 4A:
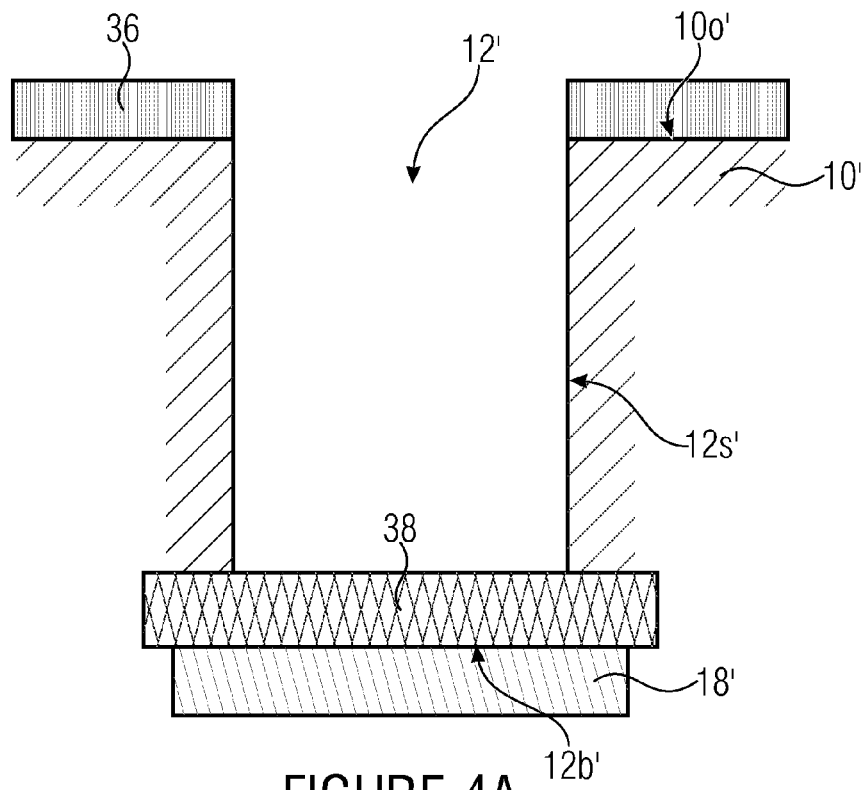
FIGS. 4a-4g show the method steps for exposing a layer buried in a substrate, including optional steps for a substrate having a stop layer.

FIG. 4*a* shows a substrate 10', wherein an (oxide) hard mask 36 is applied onto the first main surface 10'. Furthermore, another (oxide) hard mask layer 38 is introduced on the trench floor 12*k'*, wherein the layer 18' to be exposed, in the form of a metal pad, is arranged below the second hard mask 38. It is to be pointed out here that a dielectric may be provided between the metal pad 18' and the second hard mask 38. The second hard mask 38 serves as an etch stop when etching the trench 12'.

Figure 4B:
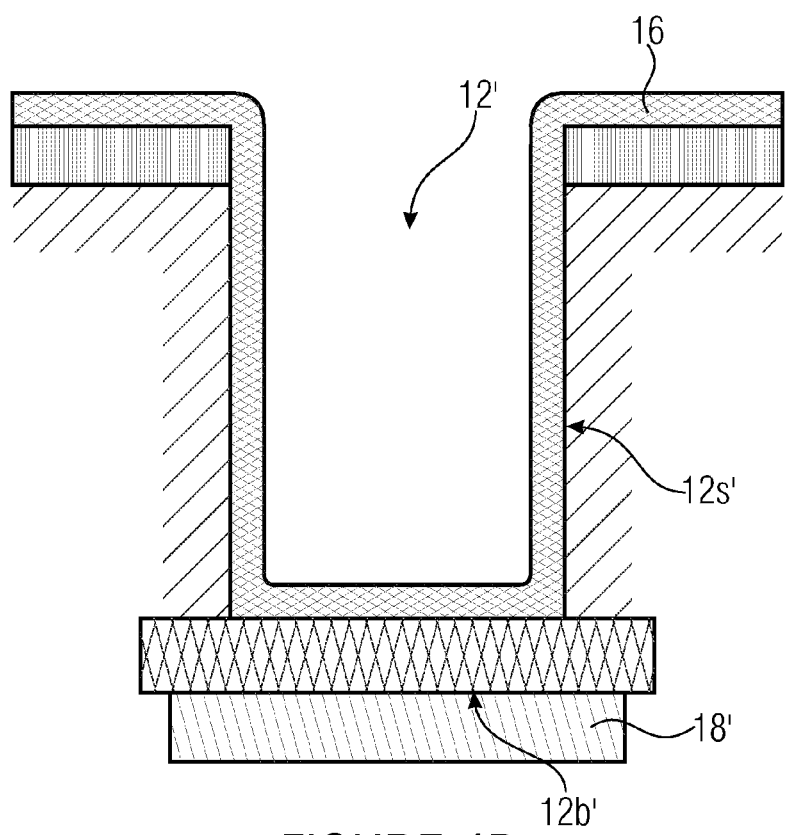

FIG. 4*b* represents the next step of applying the insulation oxide 16 onto the hard mask 36, the hard mask 38 and the trench lateral walls 12*s'*. Applying the insulation oxide 16 takes place in correspondence with the method described in FIG. 3*b*.

Figure 4C:
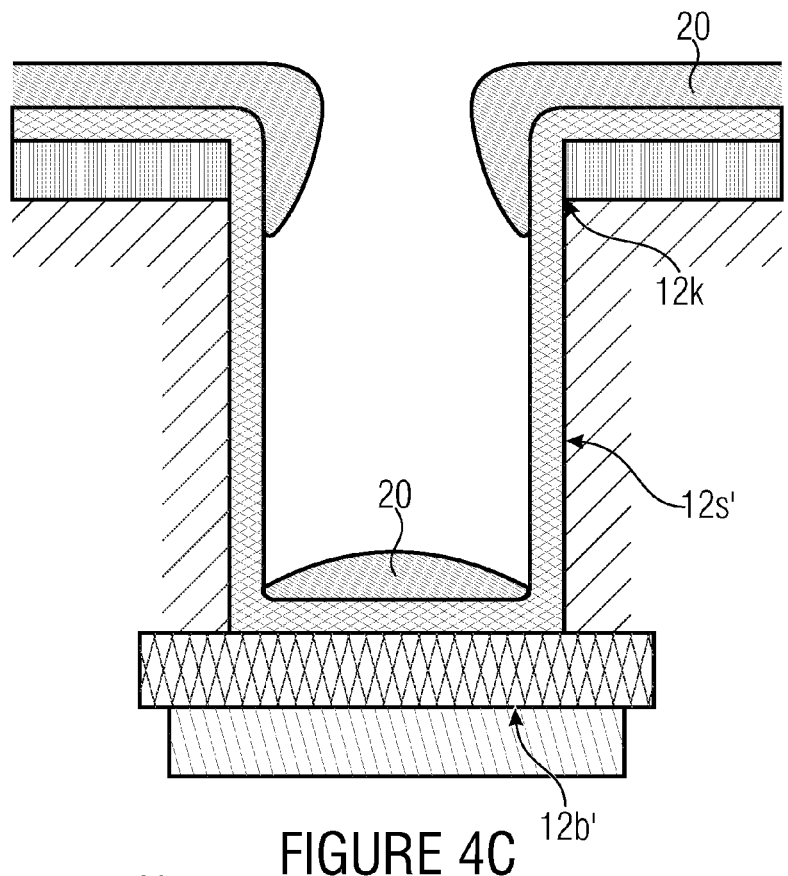

FIG. 4*c* shows the next step of applying the oxide 20. Also, in analogy to the method step discussed in FIG. 3*c*, the oxide 20 is deposited onto the main surface region 10*o'*, the edges 12*k'* of the floor 12' and the trench floor 12*b*, wherein the layer thickness of the oxide 20 deposited on the trench floor 12*b* is comparable to the oxide layer thickness 20 on the wafer surface 10*o*, due to the small aspect ratio. This has an effect on the subsequent etching process described in FIG. 4*d*.

Figure 4D:
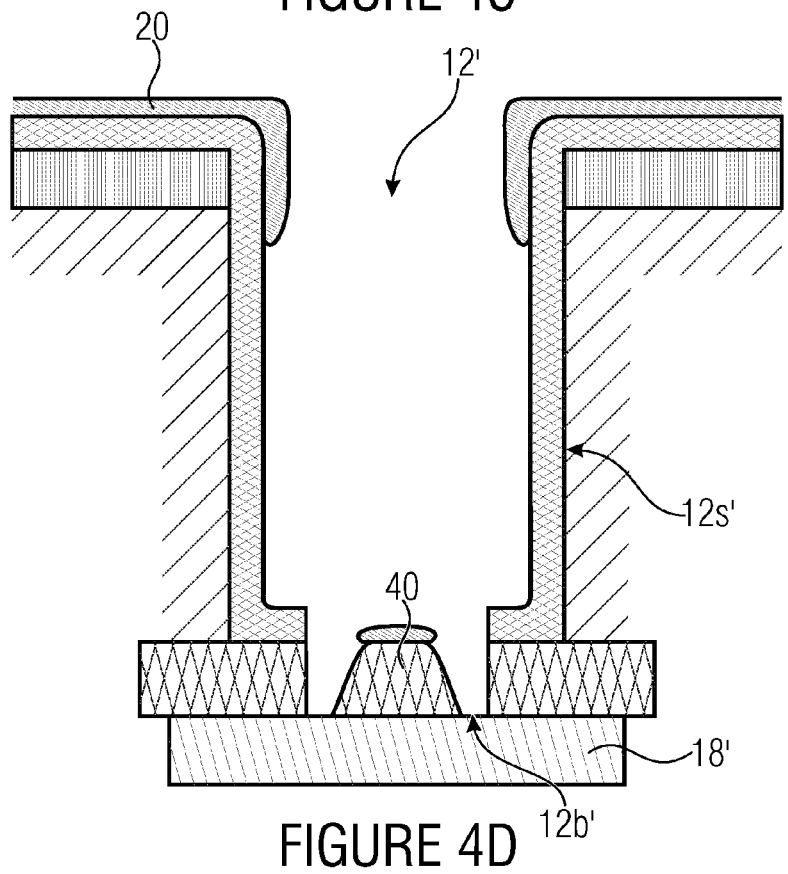

FIG. 4*d* shows the intermediate product after anisotropic etching, which is performed in analogy to what is described in FIG. 3*d*. The floor area 12*k'* here is opened at the border in the shape of a circle, wherein some oxide 40 remains in the center of the structure, due to the higher layer thickness. In the etching process, the hard mask is at the same time also removed partially such that the buried layer, or layer to be contacted, 18' is exposed. The insulation 16 on the trench wall 12s for insulating the substrate 10' relative to the contact layer 22' to be applied in the subsequent step remains unchanged.

Figure 4E:
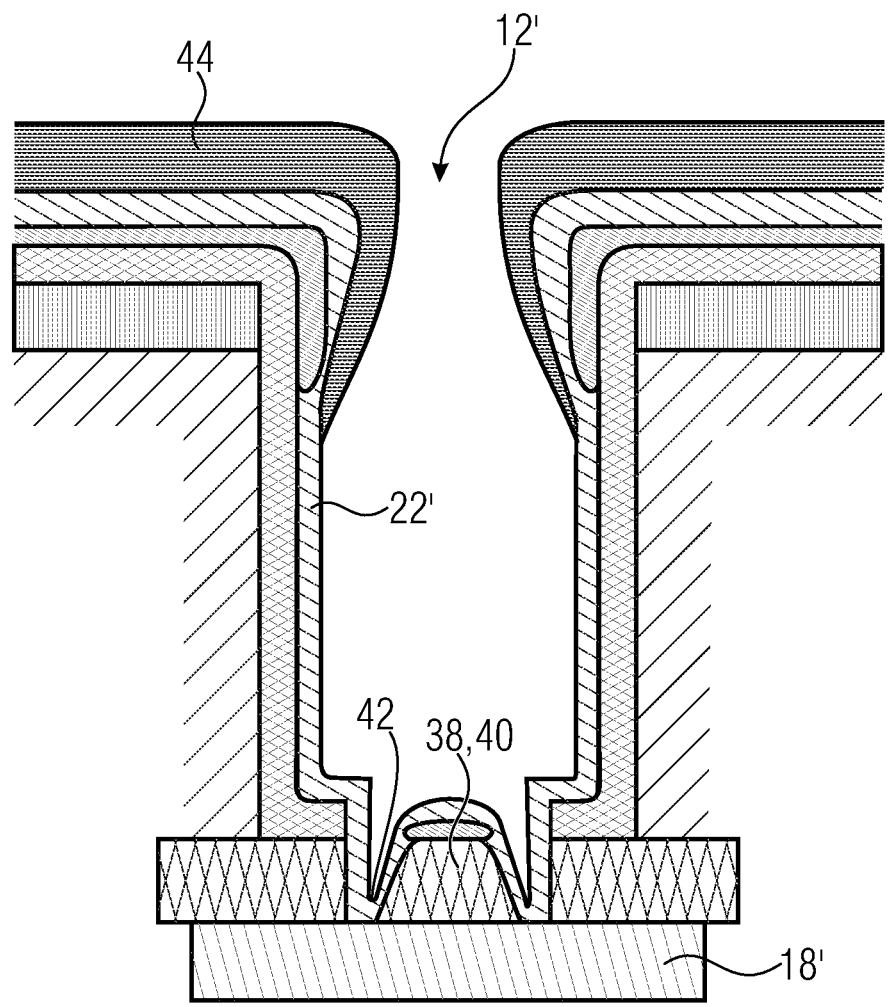

FIG. 4e shows the next step of depositing the contact layer 22' which corresponds to what has been described in FIG. 3e, wherein a circular contact area 42 forms relative to the layer to be contacted 18' due to the remaining oxide 40. This circular opened area 42 is typically sufficiently large so as to allow good electrical contacting.

In summary, it may be stated that, with structures 12' in which the same oxide deposition rate is achieved in the center of the trench floor 12k' as is on the substrate surface 10o', sufficiently large contacting areas 42 are formed, since the deposition rate will, for process reasons, be lower at the etching edge (cf. FIG. 4d, intersection between 12k' and 12s') than at the main surface region 10o. Thus, the process is self-adjusting and, consequently, very cost-efficient.

In correspondence with further embodiments, in order to improve the electrical characteristics of the contacting layer 22, same may be strengthened by means of a sputtering process. Here, the layer 22 is strengthened locally by sputtering, exemplarily aluminum or wolfram. This strengthened region is provided with the reference numeral 44. The electrical resistance is reduced locally by the sputtered regions 44.

Figure 4F:
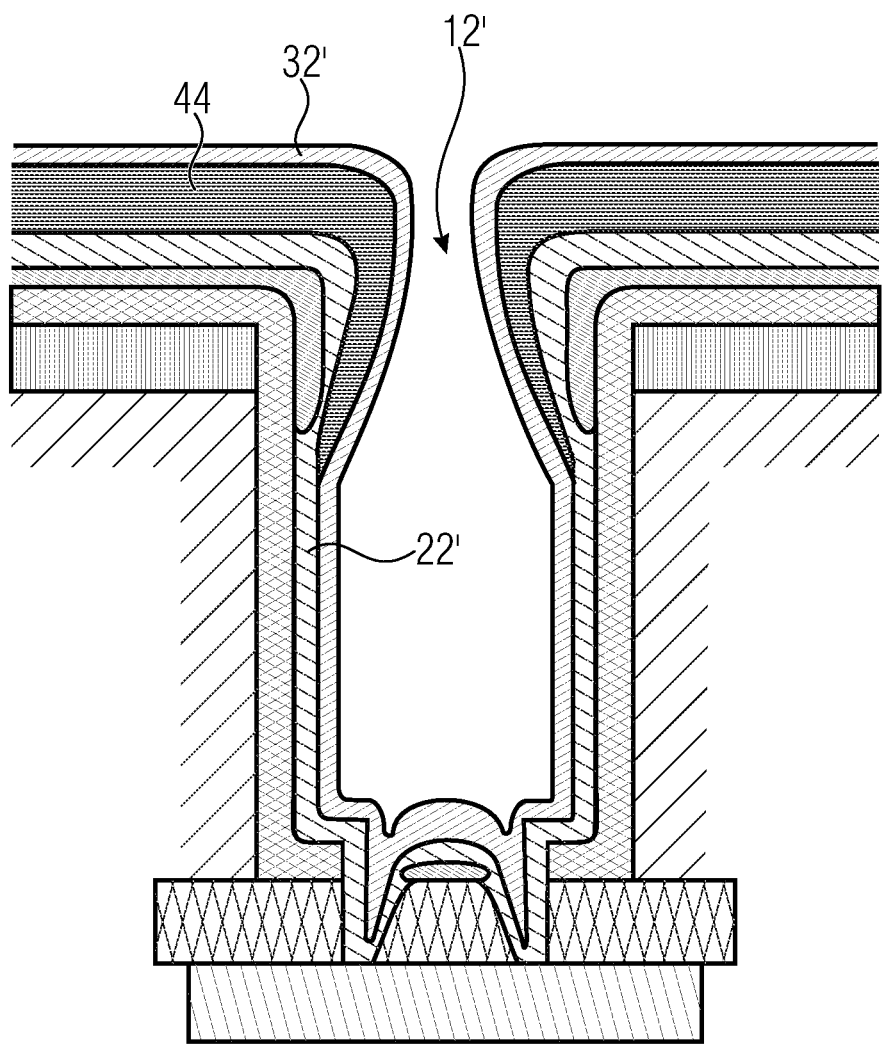

FIG. 4f shows the result of applying the second insulation oxide 32' onto the contacting layer 22' and the sputtered regions 44. It may be recognized by this that the contacting layer 22 extends along the trench wall 12s' at a constant layer thickness.

Figure 4G:
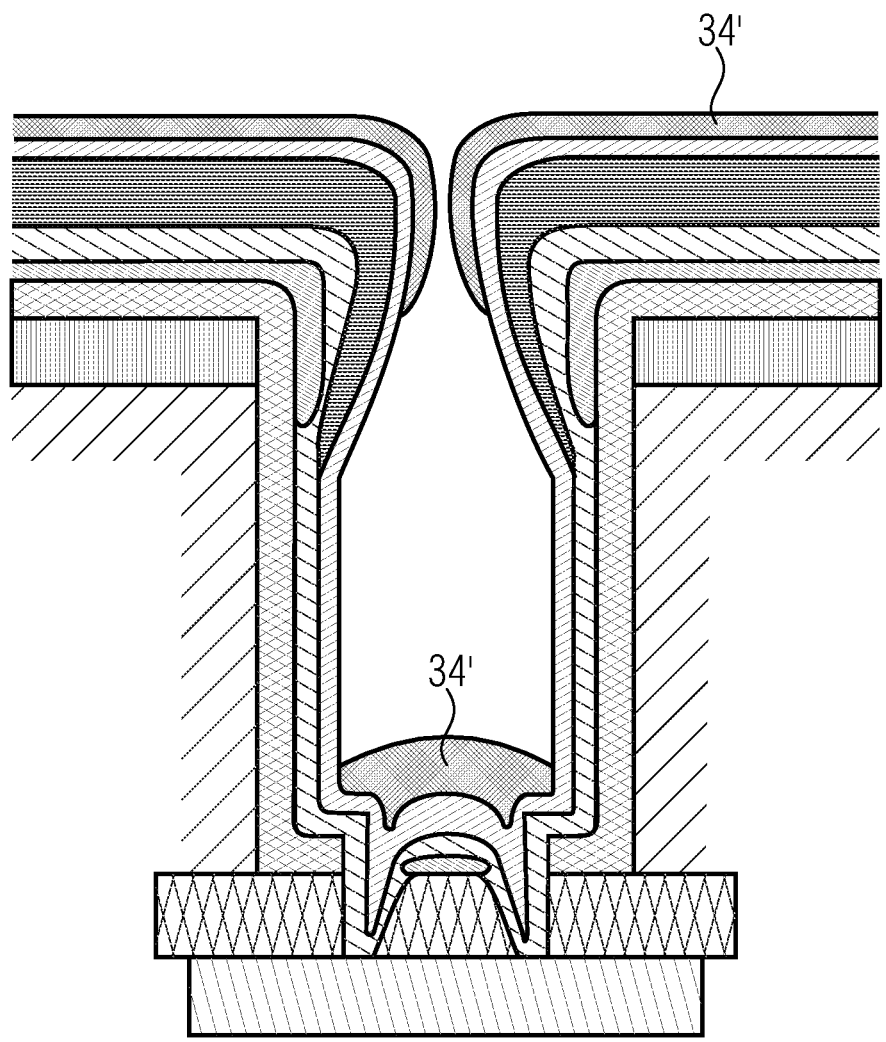

FIG. 4g shows the result of applying the photo resist 34', which corresponds to the process having been described referring to FIG. 3g.

With reference to FIGS. 3e and 4e, it is to be mentioned that depositing doped polysilicon is also possible, depending on the preceding processing of the wafer. For background explanation purposes, it is to be mentioned that the wolfram chemical vapor deposition mentioned before or copper chemical vapor deposition takes place in a temperature range of 400° C., whereas depositing polysilicon is done at 700° C. In case the wafer has been processed before, the patterns generated may be damaged at temperatures of 700° C. so that wolfram chemical vapor deposition or copper chemical vapor deposition is to be of advantage with processed wafers.

Additionally, with regard to applying the contacting layer 22 or 22', it would also be conceivable alternatively to perform covering using an electrically conductive material, exemplarily by a vapor deposition process or a suitable sputtering process, such as, for example, collimated sputtering.

It is also to be pointed out here that the layer 18 or 18' to be contacted need not necessarily be buried but may also be arranged on a second main surface region opposite the first main surface region 10o or 10o'. Thus, the buried layer may really be a metal pad to be contacted on a front side of the substrate 10 or 10' (or on a back side).

It is to be pointed out here that all the resist coating processes described before, exemplarily in lithography steps, may take place in correspondence with a spay coating process. Alternatively, it would also be conceivable for resist application to be performed by means of a dry resist technique wherein a kind of resist film is applied onto the surface to be covered such that the resist film covers the surface in a topography-conforming manner.

It is also to be mentioned here that the specific method of manufacturing is particularly dependent on the manufacturing technologies used, wherein consequently the optional steps and the order thereof may vary. Additionally, the advantageous materials and manufacturing technologies represent the advantageous materials and manufacturing technologies, however, the method claimed is not limited to the materials mentioned, nor to their manufacturing technologies.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for exposing a layer buried in a substrate via a vertical electrical connection arranged in a trench, the trench comprising an insulated lateral wall and an insulated floor, comprising:
   applying an oxide onto the substrate at least in a region of the trench such that the oxide protrudes from an edge of the trench into the trench;
   anisotropically etching at least the insulated floor of the trench, the insulated lateral wall being shielded by the oxide protruding into the trench; and
   producing a contacting layer on the insulated lateral wall such that the contacting layer is in contact with the buried layer and the contacting layer extends from a surface of the substrate along the lateral wall to the buried layer.

2. The method in accordance with claim 1, wherein the insulated lateral wall and the insulated floor are formed by a layer arranged within a trench of the substrate.

3. The method in accordance with claim 1, wherein the anisotropically etching is performed such that the insulated lateral wall remains after the anisotropically etching.

4. The method in accordance with claim 1, wherein applying the oxide takes place by means of plasma deposition.

5. The method in accordance with claim 1, wherein $SiO_2$ is applied when applying the oxide.

6. The method in accordance with claim 1, wherein anisotropic etching takes place by means of an etching method from a group of etching methods comprising reactive ion etching, plasma-enhanced etching and plasma etching.

7. The method in accordance with claim 1, wherein anisotropic etching takes place with the aid of an alternating field, the frequency of the alternating field and/or an ambient pressure being selected such that a mean free path length of reactive ions is greater than the depth of the trench.

8. The method in accordance with claim 1, wherein anisotropic etching is performed such that the insulated floor is opened at least partially.

9. The method in accordance with claim 1, wherein producing the contacting layer takes place using at least one method from a group of methods comprising chemical vapor deposition, chemical vapor deposition of wolfram or copper, growing polysilicon, metalizing, sputtering and vapor deposition.

10. The method in accordance with claim 1, comprising, after producing the contacting layer, applying a second insulation oxide onto the contacting layer, the second insulation oxide being attached to the lateral wall and the floor.

11. The method in accordance with claim 10, comprising, after applying the second insulation oxide, covering a first main surface region of the substrate with a photo resist, lithography of the first main surface region and etching the first main surface region.

12. The method in accordance with claim 10, wherein applying the insulation oxide and the second insulation oxide is performed by a method from a group of methods comprising chemical vapor deposition and sub-atmospheric pressure chemical vapor deposition.

13. The method in accordance with claim 1, comprising, before applying the oxide, applying an insulation oxide onto a substrate material at least in the trench, the insulation oxide being attached to the lateral wall and the floor.

14. The method in accordance with claim 13, comprising, before applying the insulation oxide onto the substrate material, etching the trench into the substrate.

15. The method in accordance with claim 14, wherein etching takes place by means of an etching method from a group of etching methods comprising deep trench etching, reactive ion etching, wet-chemical etching and etching using a stop layer.

16. The method in accordance with claim 1, wherein the trench protrudes from a first main surface region into the substrate along a first direction which comprises the edges of the trench, anisotropic etching being performed along the first direction.

17. The method in accordance with claim 16, wherein the lateral wall extends in parallel along the first direction with a maximum deviation of +/−5°.

18. The method in accordance with claim 16, wherein the buried layer is a pad to be contacted arranged on a second main surface region of the substrate, the second main surface region being opposite the first main surface region.

19. The method in accordance with claim 16, wherein applying an oxide takes place by means of a deposition method, wherein a deposition rate on the first main surface region is greater than a deposition rate on the floor of the trench.

\* \* \* \* \*